United States Patent [19]

Nossen

[11] 4,206,425
[45] Jun. 3, 1980

[54] DIGITIZED FREQUENCY SYNTHESIZER

[75] Inventor: Edward J. Nossen, Cherry Hill, N.J.

[73] Assignee: RCA Corporation, New York, N.Y.

[21] Appl. No.: 937,834

[22] Filed: Aug. 29, 1978

[51] Int. Cl.$^2$ .................. H03B 3/04; H03C 3/00; H04L 27/20

[52] U.S. Cl. ........................ 332/19; 455/113; 375/120; 331/1 A; 331/23

[58] Field of Search .......... 332/19; 178/66 A; 325/163, 148, 161; 331/1 A, 12, 23, 25

[56] References Cited

U.S. PATENT DOCUMENTS

| | | | |
|---|---|---|---|
| 2,540,333 | 2/1951 | Hugenholtz | 331/12 |
| 4,006,418 | 2/1977 | Liskov et al. | 325/163 |
| 4,021,757 | 5/1977 | Nossen | 332/19 |

*Primary Examiner*—Siegfried H. Grimm
*Attorney, Agent, or Firm*—H. Christoffersen; Samuel Cohen; Donald W. Phillion

[57] ABSTRACT

A frequency synthesizer including a phase lock loop comprising a voltage controlled oscillator, a four phase modulator for modulating the oscillator output signal, a phase detector for comparing the phases of a reference signal and the output signal of the modulator and filter means for supplying the phase detector output signal back to the oscillator. The two most significant bits of an arithmetic synthesizer are supplied to the modulator to produce, in the absence of additional modulating signals, discrete increments of 90° phase shift in the oscillator output signal. To eliminate phase jitter, the remaining lower order bit positions of the arithmetic synthesizer are converted to analog voltages which are supplied into the phase lock loop to effect a gradual phase shift between the otherwise discrete 90° phase shifts. Continuous phase, constant amplitude output signal is thereby produced having a frequency translated by the phase shifts introduced by the arithmetic synthesizer.

7 Claims, 19 Drawing Figures

PRIOR ART

Fig. 19

DIGITIZED FREQUENCY SYNTHESIZER

This invention relates generally to frequency synthesizers and more particularly to improvements in frequency synthesizers which combine an arithmetic synthesizer and a phase lock loop to produce relatively distortion free frequency translation of a voltage controlled oscillator (VCO) output signal.

In U.S. Pat. No. 4,021,757, issued to the present inventor, there is described a structure for translating the frequency of a VCO output signal by means of a four phase modulator and the two most significant bits of an arithmetic synthesizer. An arithmetic synthesizer is basically a digital accumulator into which predetermined binary incremental values are added at periodic intervals. Eventually the accumulator will become filled and upon the entry of the next increment, will overflow and become empty, except for that amount by which the said next increment exceeded the accumulator's capacity. The filling and emptying of the accumulator occurs repeatedly again at an average frequency $f_a$ which is quite constant over a long time time period but whose instantaneous frequency and phase contain considerable error.

During the filling of the accumulator, the most significant bit position $MSB_1$ and the next most significant bit position $MSB_2$, will assume conditions of binary 1's and 0's of different permutations. More specifically, at about one fourth full, the content of $MSB_1$ will be a binary 0 and and the content of $MSB_2$ a binary 1.

At about one half full, the contents of $MSB_1$ and $MSB_2$ become a binary 10. At about three fourth capacity, $MSB_1$ and $MSB_2$ will contain a binary 11. When the accumulator overflows and becomes nearly empty, $MSB_1$ and $MSB_2$ will contain a binary 00.

These four binary bit permutations contained in $MSB_1$ and $MSB_2$, binary 00, 01, 10 and 11, are supplied to the four-phase modulator means of U.S. Pat. No. 4,021,757 where they function to shift the phase of the VCO by 90° four times during each cycle of filling of the accumulator. Thus, the VCO frequency is translated by the fill-up frequency $f_a$ of the accumulator. Since the capacity of the accumulator can be made large or small, and the increments added therein can also be made large or small, and further, the frequency at which the increments are added can be large or small, it is evident that $f_a$ can be made to vary over a wide range.

However, the value of $f_a$, the 90° phase shifts which occur in the VCO output do so in a discrete manner at a frequency 4 $f_a$. Such abrupt 90° changes in phase may produce undesirable spurious signals which lower the signal-to-noise ratio of the VCO output.

In accordance with a preferred form of the invention, there is provided a voltage controlled oscillator and an arithmetic synthesizer having a cyclical frequency $f_a$ and comprising a most significant bit position $MSB_1$, a next most significant bit position $MSB_2$ and a plurality of lower bit positions. Also provided is a phase lock loop comprising system modulating means responsive to the binary bits contained in $MSB_1$ and $MSB_2$ and to the binary bits contained in the lower bit positions of the arithmetic synthesizer to effect a continuous change in phase of the output signal of said voltage controlled oscillator to cause a frequency change in said output signal equal to $f_a$.

In prior art devices the two most significant bits of an arithmetic synthesizer have been employed to shift the phases of the sine and cosine output of a VCO in a quadraphase modulating system in discrete steps of 90°. Since, in the present invention, the remaining, lower order bit positions of the arithmetic synthesizer are employed to provide for a smooth and continuous phase shift in the VCO output signal, a brief discussion of the operation of an arithmetic synthesizer and the type waveforms which can be generated thereby will precede a discussion of the overall systems.

Figure 1:
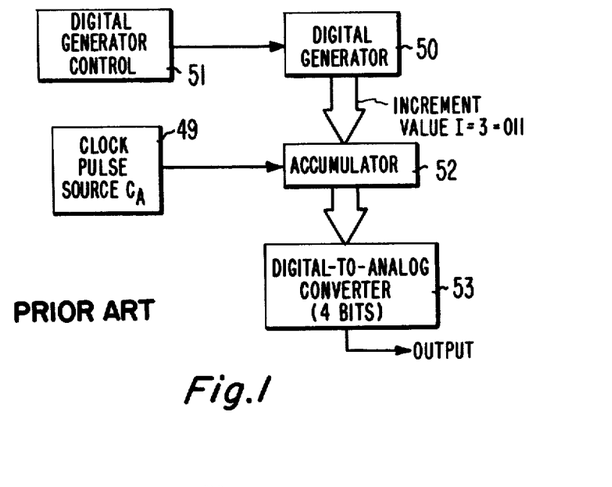
FIG. 1 is a block diagram of an arithmetic synthesizer which may be employed in the invention.

In the prior art arithmetic synthesizer shown in FIG. 1, a constant binary incremental value I is supplied to a digital generator 50 by means of a digital generator control 51. The binary constant increment I is supplied to an accumulator 52 at every occurrence of a clock pulse $C_A$, which is supplied from clock pulse source 49.

Figure 2:
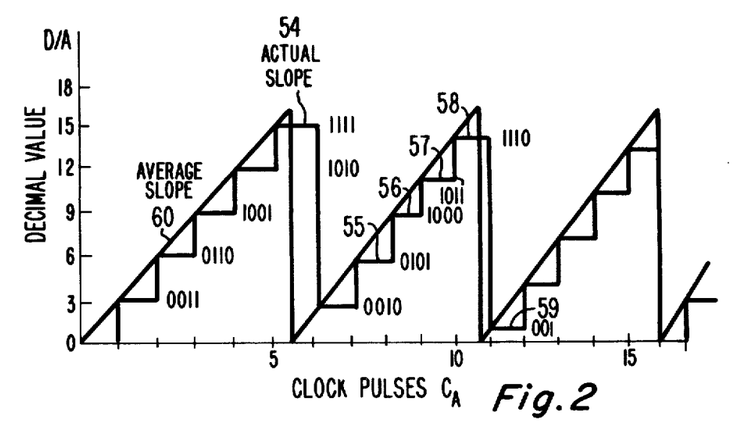
FIG. 2 shows a typical stepped sawtooth waveform generated at the output of an arithmetic synthesizer and also shows the smooth sawtooth waveform which can be derived from the stepped sawtooth waveform.

Assume the constant increment I to be a binary 011 and the accumulator 52 to have four bit positions so that the binary value contained in the accumulator will increase by a binary 011 at each clock pulse $C_A$ until it reaches the value of binary 1111, as shown at the level 54 in the waveform of FIG. 2. The next increment of binary 011 supplied to accumulator 52 will cause said accumulator to overflow with a remainder of binary 010 left therein. The next increment of binary 011 will increase the content of the accumulator from 0010 to 0101, as shown at level 55 in FIG. 2. Succeeding increments of binary 011 will successively produce a binary 1000 at level 56, a binary 1011 at level 57, and a binary 1110 at level 58. The next increment of binary 011 will again overflow the capacity of accumulator 52 with the binary remainder 001 therein, as indicated by level 59 in FIG. 2.

It can be seen that the accumulated binary value contained in accumulator 52 represents a set of values which, when supplied to the digital-to-analog converter 53 of FIG. 1, results in the staircase waveform 54-59 of FIG. 2. The average slope can be represented by a sawtooth waveform 60.

Figure 3:
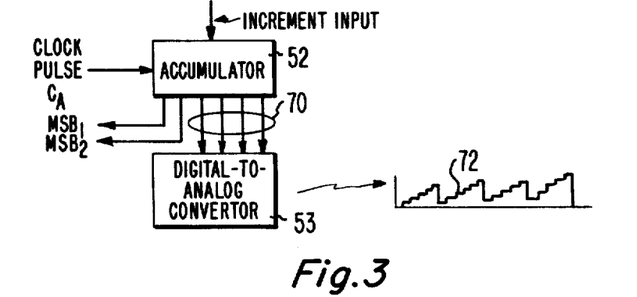
FIG. 3 is a block diagram of a modification of an arithmetic synthesizer particularly adapted for use in the present invention.
Figure 9:
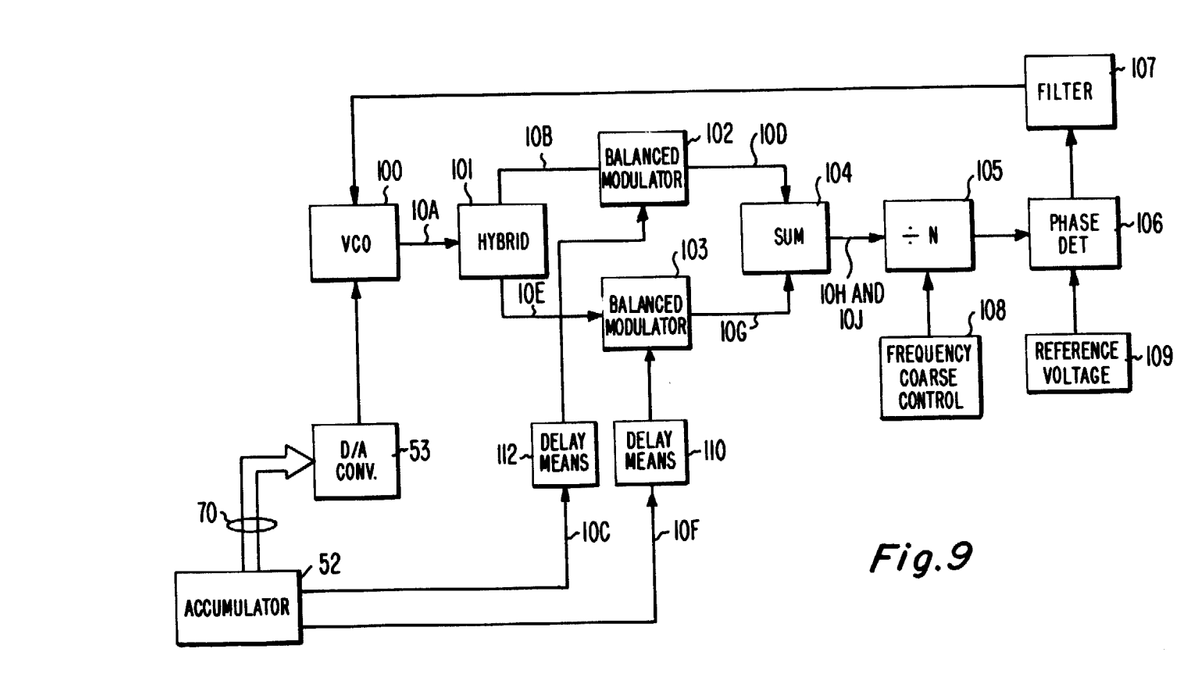
FIG. 9 is a block diagram of one form of the invention which effects phase correcting frequency translation with the aid of an arithmetic synthesizer.

FIG. 3 shows a particular adaptation of the arithmetic synthesizer FIG. 1 which is employed in the form of the invention of FIG. 9. The relationship of this synthesizer to FIG. 9 will be described later in connection with the discussion of FIG. 9.

In FIG. 3 the binary bit content of the most significant bit, $MSB_1$, and the next most significant bit, $MSB_2$, are not supplied from the accumulator 52 to the digital-to-analog converter 53. Only the bits in the remaining lower bit position outputs 70 are supplied to digital-to-analog converter 53 to generate the stepped sawtooth waveform 72.

Figure 4:
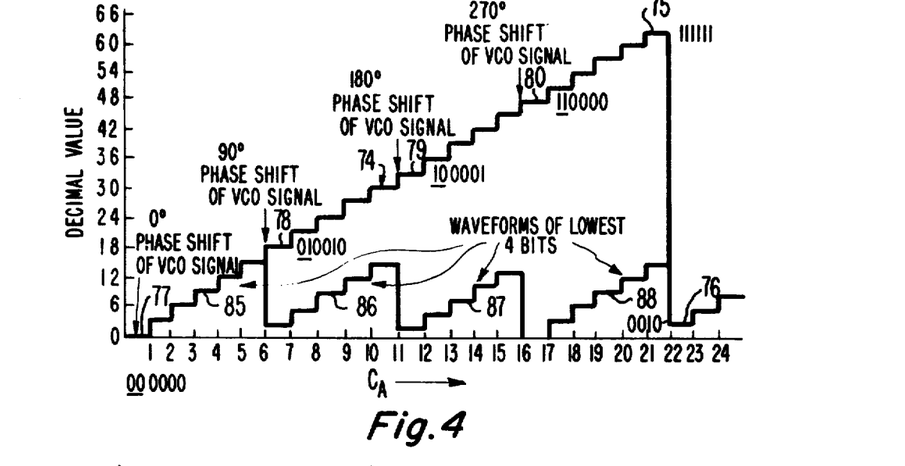
FIG. 4 shows a waveform of the stepped output of an arithmetic synthesizer employing all of its bit positions and also shows a sawtooth-shaped stepped waveform of the synthesizer employing all of its bit positins except the most significant bit position and the next-to-most significant bit position.

A more complete showing of the waveforms generated by accumulator 52 and digital-to-analog converter 53 is shown in FIG. 4 wherein waveform 74 represents the total accumulated binary value in accumulator 50 as increments of binary 011 are added thereto, with a total of 63 (binary 111111) at level 75. The accumulator 52 will overflow upon the next incremental addition of binary 011 with a remainder of binary 0010 as shown at level 76 in FIG. 4.

Of particular importance in the long stepped waveform 74 are the levels 77, 78, 79, 80, 75 and also 76, at which times the permutations of the bits in the two most significant bit positions, $MSB_1$ and $MSB_2$, occur. Specifically, at level 77 the bit positions $MSB_1$ and $MSB_2$ contain a binary 00, at level 78 $MSB_1$ and $MSB_2$ contain a binary 01, at level 79 they contain a binary 10, at level 80 they contain a binary 11 and at level 76 they change back to their original state to contain a binary 00. Such changes in the bits of the two most significant bit positions $MSB_1$ and $MSB_2$ occur approximately every 90° in the complete cycle of the filling of the accumulator 52 (FIG. 3) to overflow condition, which cycle occurs at a frequency designated herein as $f_a$. By changing the increment I which is added to the accumulator 52, the frequency $f_a$ obviously can also be changed. For example, if I is increased or decreased linearly with time, the output frequency of accumulator 52 can be linearly increased or decreased, thus effecting a linear frequency modulated signal which can be employed to alter the frequency of the output of the voltage controlled oscillator accordingly.

It is to be noted in FIG. 3 that only the four least significant bit positions of accumulator 52 are supplied to the digital-to-analog converter 53, via leads 70. Such four least significant bit positions function as a separate accumulator in that they will build up to the maximum capacity as increments of binary 011 are supplied to the accumulator 52 and then will overflow and reset to zero with some remainder value. The resetting of the value contained in the four least significant bit positions of accumulator 52 occurs at each change in the two most significant bit positions $MSB_1$ and $MSB_2$, as shown in FIG. 4, and results in the four stepped sawtooth shaped waveforms 85, 86, 87 and 88 of FIG. 4. Each of the four stepped waveforms 85, 86, 87 and 88 can be seen to overflow and empty, with some remainder, at $C_A$ clock pulses 6, 11, 16 and 22, which clock pulses are each coincident with the change in content of one or the other of the two most significant bit positions $MSB_1$ and $MSB_2$.

The four sawtooth waveforms 85-88 are actually produced by digital-to-analog converter 53 of FIG. 3 and are supplied directly to the VCO 100 of FIG. 9 to cause a gradual and linear shifting of the phase of the output signal of VCO 100 towards a 90° maximum. However, the final shift to 90° is completed by the application of a two-level signal, generated by the bits in the two most significant bit positions $MSB_1$ or $MSB_2$, to one of the balanced modulators 102 or 103 of FIG. 9. That particular stepped sawtooth voltage of waveforms 85-88 of FIG. 4 which is then being supplied to the VCO 100 of FIG. 9 is returned to substantially zero value essentially simultaneously with the application of the two-level signal to the appropriate balanced modulators 102 or 103 as to provide a substantially constant rate phase shift over 90° to the VCO output signal. The foregoing will be explained in more detail in the more general discussion of the system as set forth immediately below.

Figure 10:
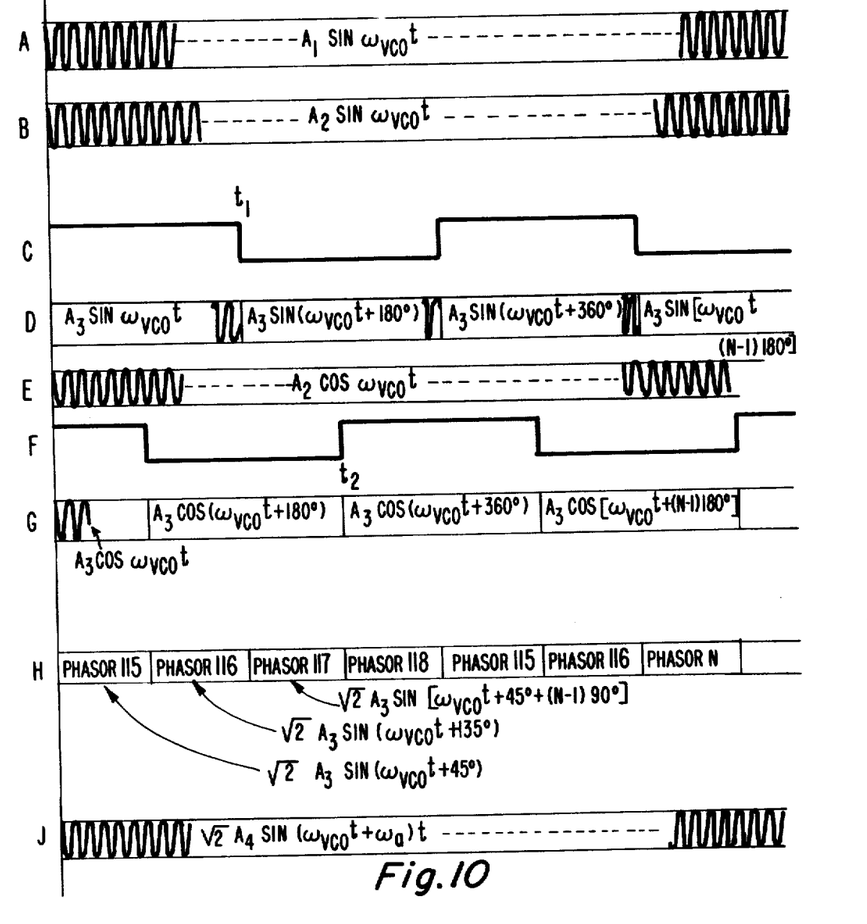
FIG. 10 is a set of waveforms and expressions illustrating the signals generated at various points in the logic diagram of FIG. 9.
Figure 11:
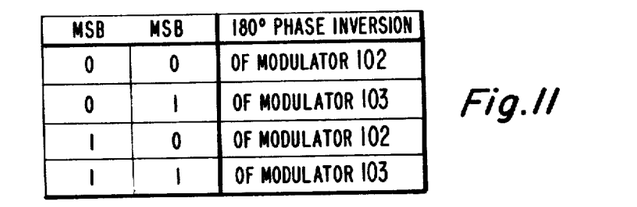
FIG. 11 is a truth table illustrating the 180° phase inversion produced by balanced modulators on sine and cosine output signals of frequency $f_{VCO}$ in response to the contents of the two most significant bit positions of the arithmetic synthesizer.

A signal ($A_1 \sin \omega_{VCO} t$), shown in FIG. 10A, is supplied from the voltage controlled oscillator (VCO) 100 to a hybrid circuit 101 which responds thereto to provide sine and cosine signals of frequency $f_{VCO}$, appearing on leads 10B and 10E in FIG. 9 and shown in FIGS. 10B and 10E. Such two sine and cosine signals are supplied, respectively, to balanced modulators 102 and 103. Also supplied to modulators 102 and 103, are quadrature related two-level signals generated from the contents of $MSB_1$ and $MSB_2$ of the arithmetic synthesizer accumulator 52. Such two-level signals are shown in FIGS. 10C and 10F and appear on leads 10C and 10F in FIG. 9. For purposes of brevity, the signals appearing on various leads will be identified herein by the same reference characters which identify the leads on which the signals appear, and which is also the figure numbers which show the waveforms. Thus signals 10C and 10F appear on leads 10C and 10F and are shown in FIGS. 10C and 10F.

It is a characteristic of the balanced modulators 102 and 103 that the change in level of the two-level signals 10C and 10F supplied thereto, will invert the phase of the sine or cosine waveform being supplied thereto from hybrid 101. Thus, balanced modulator 102, which receives the signal 10B ($A_2 \sin \omega_{VCO} t$) from hybrid 101, and also receives the modulating two-level signal 10C from accumulator 52 through delay means 112, will produce a bi-phase output sine signal 10D, as defined in FIG. 10D, which is a constant amplitude signal whose phase becomes inverted each time the level of the applied two-level signal 10C changes.

Similarly, the balanced modulator 103 responds to the two-level signal 10F, shown in FIG. 10F and supplied through delay means 110, and also to the voltage 10E ($A_2 \cos \omega_{VCO} t$), shown in FIG. 10E, to produce a bi-phase output cosine signal 10G, shown in FIG. 10G. The summer 104 then functions to add together the bi-phase sine and cosine signals 10D and 10G, shown in FIGS. 10D and 10G, to produce an output signal which advances 90° in phase each time one of the two-level signals 10C or 10F changes level.

Figure 15:
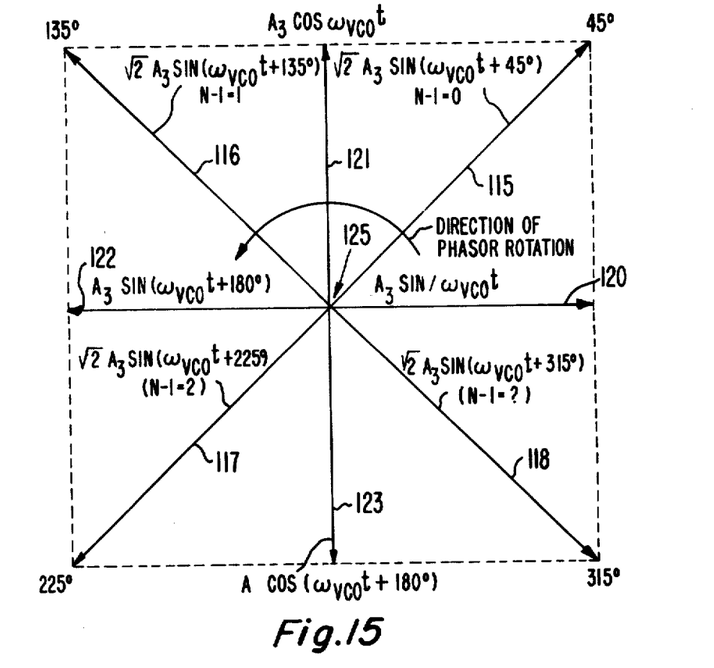
FIG. 15 is a vector diagram showing the generation of the output signal of the system of FIG. 9 in terms of phasors as the phase of said output signal is advanced periodically due to modulation by the output of the arithmetic synthesizer.

The foregoing is shown in a different manner in the vector diagram of FIG. 15. In FIG. 15 the four phasors 115, 116, 117, and 118 represent resultant voltages which can appear at the output of summer 104 of FIG. 9 with discrete 90° phase shifts occurring in the output of the VCO 100. More specifically, phasor 115, for example, is produced as a result of the addition of voltage vectors 120 and 121 supplied from modulators 102 and 103, respectively, and added in summer 104. At time $t_1$ in FIG. 10C, when signal 10C changes levels, the vector 120 of FIG. 15 will reverse direction and become vector 122 which, when combined with vector 121, will produce the phasor 116, which can be seen to be advanced 90° from phasor 115.

Next, the level of two-level signal 10F in FIG. 10F will reverse at time $t_2$ to reverse the direction of vector 121 in FIG. 15 so that vector 121 becomes vector 123, which is supplied to summer 104. The summing of vectors 123 and 122 results in phasor 117 which can be seen to be advanced 90° from phasor 116.

Such 90° increments of phase advance occur in the output of summer 104 at the rate of 4 $f_a$ so that the long term frequency of the output of summer 104 is $f_{VCO+fa}$.

Figure 12:
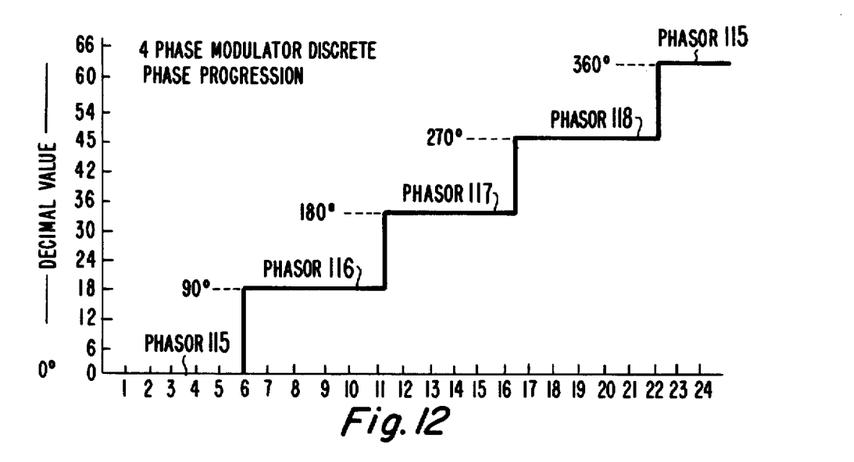
FIG. 12 is a waveform illustrating the discrete 90° phase shifts created in the output signal of the voltage controlled oscillator of FIG. 9 in response to changes in the two most significant bits, $MSB_1$ and $MSB_2$, of the arithmetic synthesizer.
Figure 13:
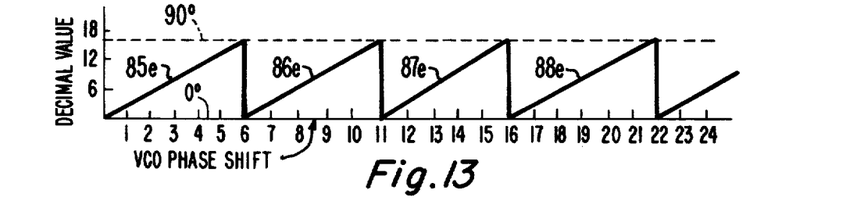
FIG. 13 shows the sawtooth waveform of the analog output voltage derived from the lower order bit positions of the arithmetic synthesizer, (other than the two most significant bits), which analog output is supplied to the voltage controlled oscillator in between the otherwise discrete 90° phase shifts of FIG. 12 to produce a continuous and smooth change of phase in the output signal of the VCO.
Figure 14:
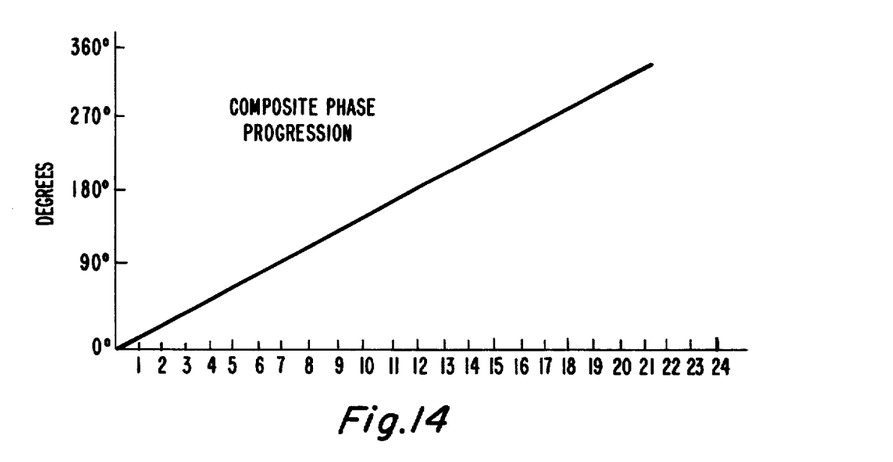
FIG. 14 shows the resulting linear composite phase progression of the output signal of the variable controlled oscillator of FIG. 9.

The discrete shifts of 90° between phasors 115, 116, 117 and 118 are shown diagrammatically in FIG. 12, with each rising level indicating an additional 90° phase shift. To provide a nearly continuous change in phase in between the discrete phasors 115, 116, 117 and 118, the stepped sawtooth voltage waveforms 85, 86, 87 and 88 of FIG. 4 are employed. Such waveforms 85-88 are supplied from the digital-to-analog converter 53 to the VCO 100 of FIG. 9. When the phase steps are small nearly smooth sawtooth waveforms are supplied to VCO 100, as indicated in FIG. 13, to continuously change the phase of the VCO 100 output in between the discrete 90° phase changes caused by changes in the contents of $MSB_1$ or $MSB_2$. Since a change in the contents of $MSB_1$ or $MSB_2$ will immediately result in 90° phase change regardless of the instantaneous phase of the signals being supplied to balanced modulators 102 or 103 of FIG. 9, it is necessary that the sawtooth waveform of FIG. 13 be returned to zero substantially concurrently with the change in the contents of $MSB_1$ or $MSB_2$. Such timely returning to zero of the sawtooth waveform of FIG. 13 can be accomplished by delay means 110 and 112 which delay changes in the two-level signals generated by the contents of $MSB_1$ and $MSB_2$ until the sawtooth waveform has in fact returned to zero, as indicated at clock times 6, 11, 16 and 22 of FIG. 13. Delay means 110 and 112 are not required when the 90° phase transitions occupy only a small fraction of the dwell period. The composite phase progression of the output of summer 104 of FIG. 9 is indicated by the linear curve of FIG. 14.

It is to be understood that the vector diagram of FIG. 15 shows only the discrete 90° phase changes due to changes in $MSB_1$ and $MSB_2$. In fact, however, with the sawtooth waveforms from the digital-to-analog converter 53 of FIG. 9 being supplied directly to the VCO 100, the phasor 115 of FIG. 15 will rotate at a uniform counterclockwise angular velocity to the position of phasor 116 during the period of one of the sawtooth waveforms 85e of FIG. 13 and then will continue to rotate to the position shown as phasor 117 during the single sawtooth waveform 86e of FIG. 13. Similarly, with each succeeding single sawtooth waveform of FIG. 13, the phasor will rotate 90° to the next position, thus, in fact, continuously rotating in the counterclockwise direction around the axis 125 of the vector diagram of FIG. 15. A clockwise rotation can also be effected through reconnection of the balanced modulator drive signals. The resultant signal 10J, shown in FIG. 10J and appearing at the output of summer 104 is as follows:

$$\sqrt{2A_4} \sin (\omega_{VCO} + \omega_a)t$$

Such signal 10J is divided by a factor N by divider 105 of FIG. 9 (N being determined by coarse frequency control 108) and then supplied to phase detector 106 where its phase is compared with that of a reference signal from source 109. A filter 107 supplies the output of phase detector 106 to VCO 100 to adjust the frequency of the output signal thereof by the incremental frequency $f_a$, which was injected into the system by the arithmetic synthesizer (accumulator 52).

It is noted that if the frequency of the output of summer 104 is increased by $f_a$, then the frequency of VCO 100 will be decreased by frequency $f_a$ to balance the phase lock loop system.

Figure 16:
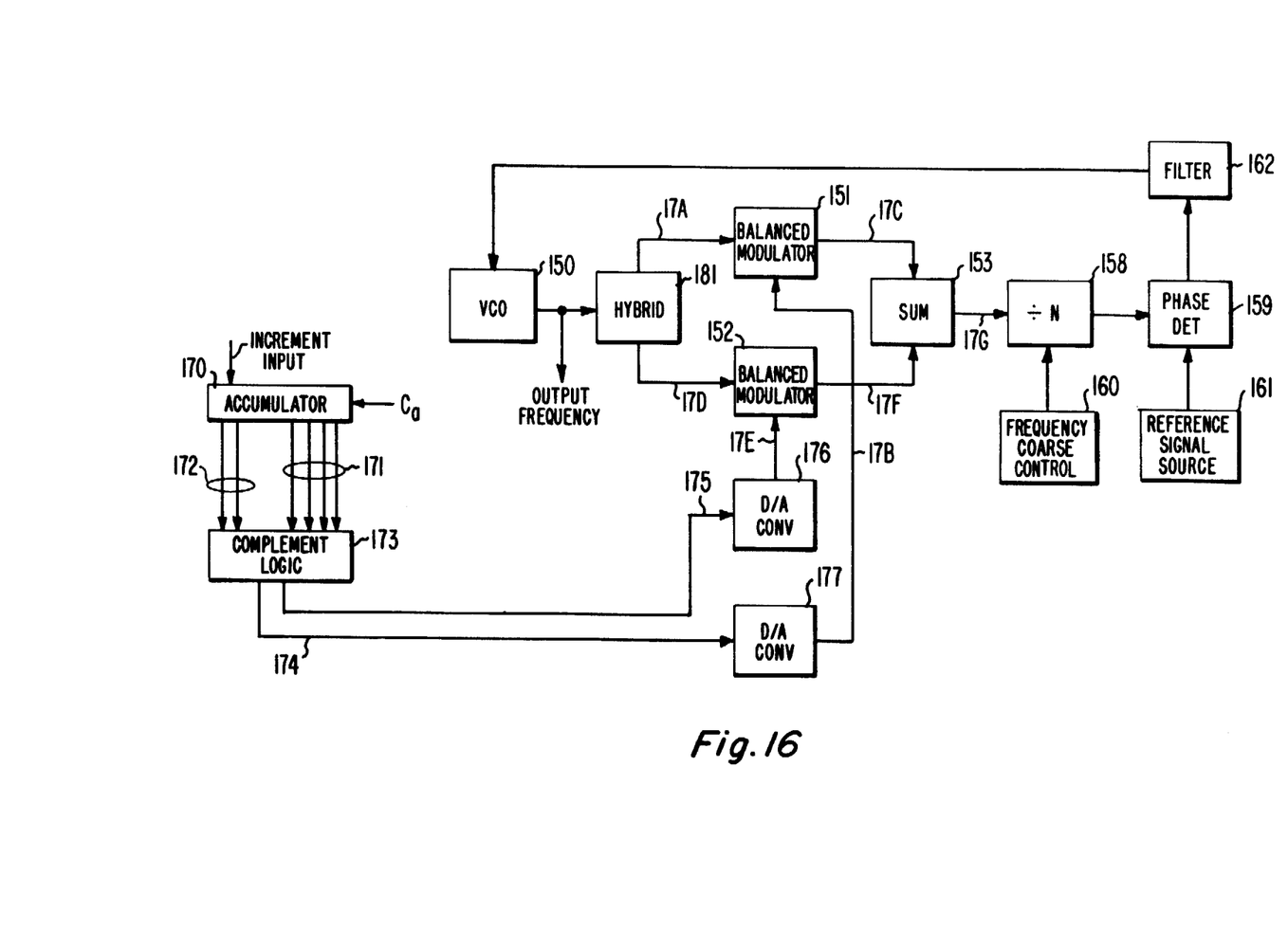
FIG. 16 is a block diagram of another form of the invention capable of producing single sideband translation of the VCO output signal.

Referring now to FIG. 16, there is shown another form of the invention wherein the frequency of the VCO 150 output signal is translated by an amount equal to the frequency $f_a$ of the arithmetic synthesizer accumulator 170, with the resulting translated VCO output signal appearing at the output of summer 153. The output signal from summer 153 will have a constant amplitude and a continuous phase.

Figure 5:
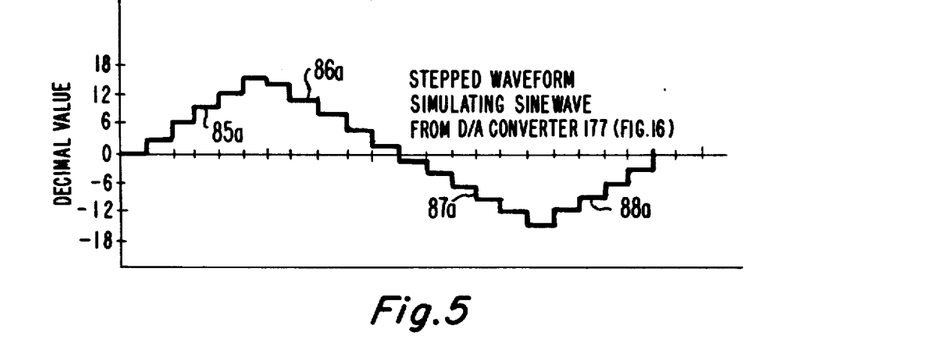
FIG. 5 shows a stepped output of the arithmetic synthesizer which simulates a sine waveform when filtered.
Figure 6:
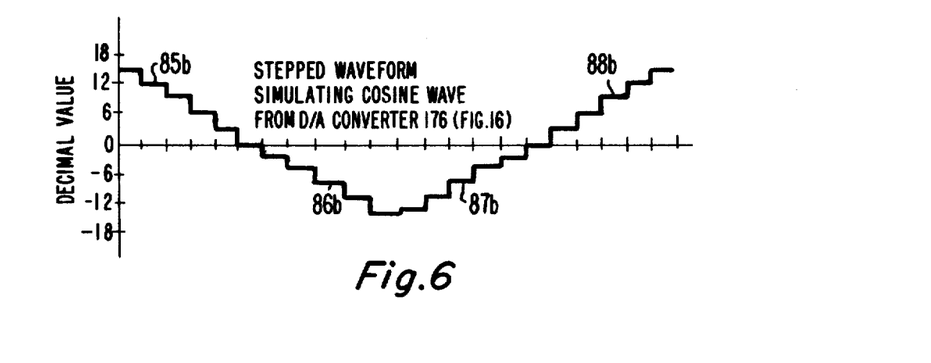
FIG. 6 shows a stepped output of the arithmetic synthesizer which simulates a cosine waveform when filtered.

The principal difference between the system of FIG. 9 and that of FIG. 16 is that the output of accumulator 170 of FIG. 16 is supplied to complement logic 173 and digital-to-analog converters 176 and 177 which produce the two stepped triangular waveforms of FIGS. 5 and 6. Such triangular waveforms approximate sine and cosine waves of frequency $f_a$. Use of a sine/cosine look-up table structure (not shown) between complement logic 173 and digital-to-analog converters 176 and 177 can produce nearly true sine and cosine waveforms of frequency $f_a$. Such true or approximated sine and cosine waveforms are employed to product modulate sine and cosine output signals of frequency $f_{VCO}$ supplied to balanced modulators 151 and 152 from hybrid 181.

Before going on, the arithmetic synthesizer will be discussed in more detail to more fully clarify the relation of the output of the arithmetic synthesizer accumulator 170 to the operation of the structure of FIG. 16.

The output of accumulator 170, which is shown by the waveforms 85-88 of FIG. 4, are supplied to complement logic 173. More specifically, the four least significant bits appearing on output leads 171 function to form the stepped waveforms 85, 86, 87 and 88 of FIG. 4. The two most significant bits appearing on output leads 172 function to control the complement logic 173 to generate the stepped simulated sine and cosine waveforms shown in FIGS. 5 and 6 by inverting and complementing, where necessary, the digital input signals making up the steps of waveforms 85, 86, 87 and 88. The details of such complement logic are well known and are not shown specifically in the drawing.

One example will be given, however, to indicate the type logic required to perform the necessary complementing and changing of signs of the waveforms 85-88 to form a simulated sine wave. Specifically, in FIG. 5 the waveform 85a is derived directly from stepped waveform 85 of FIG. 4, the waveform 86a is derived from waveform 86 of FIG. 4 but in complemented form and without a change in sign, the waveform 87a is derived from the waveform 87 of FIG. 4, inverted although not complemented, and the waveform 88a of FIG. 5 is derived from the waveform 88 of FIG. 4 but both complemented and with the sign reversed.

In a similar manner the complement logic 173 of FIG. 16 functions to fashion the stepped cosine wave shown in FIG. 6 with the sections 85b, 86b, 87b and 88b being derived, respectively, from the stepped waveforms 85, 86, 87 and 88 of FIG. 4 by appropriate complementing and sign change.

Figure 17:
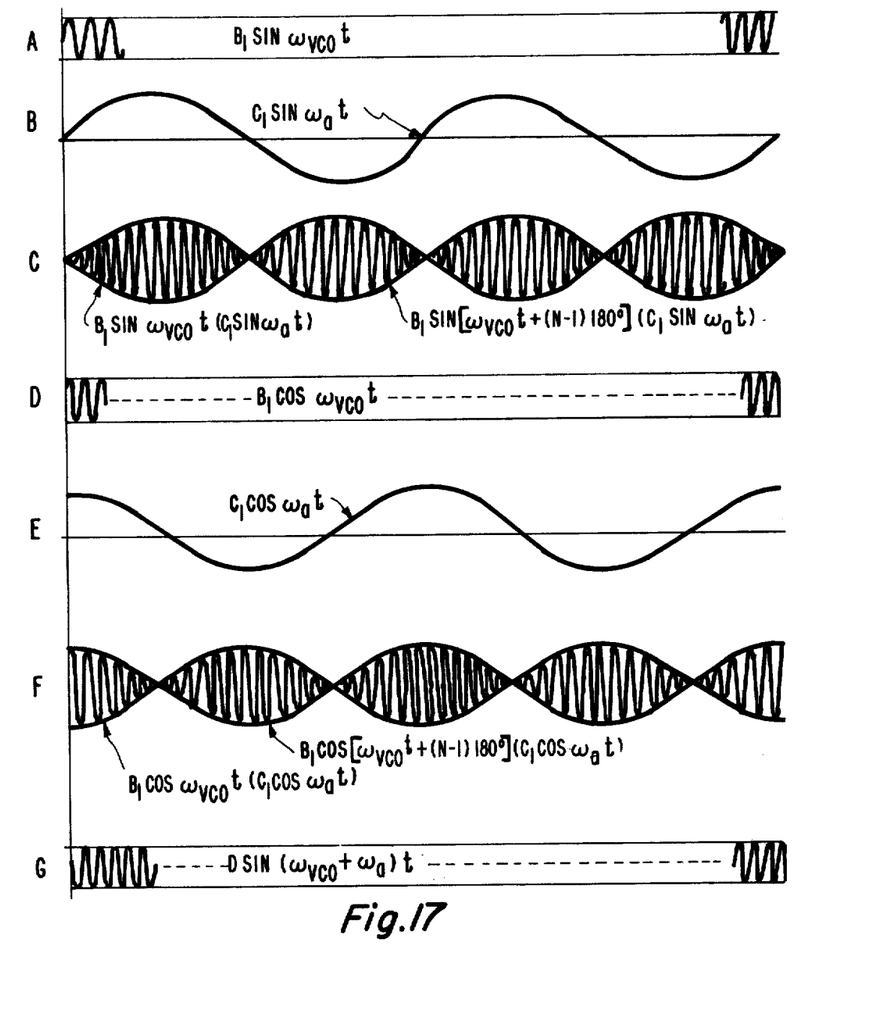
FIG. 17 is a set of waveforms and expressions of signals appearing at various points in the logic diagram of FIG. 16.

The simulated stepped sine and cosine numerical outputs from complement logic 173 are supplied, respectively, to the digital-to-analog converters 177 and 176 which respond thereto to produce sine wave 17B and cosine wave 17E approximations, respectively, and which are shown in FIGS. 17B and 17E. The sine wave of FIG. 17B is supplied to one input of balanced modulator 151 of FIG. 16 which also receives from hybrid 181 a signal 17A which is derived from the VCO 150 output and which is defined in FIG. 17A as $B_1 \sin \omega_{VCO}t$. The output of balanced modulator 151 is shown in FIG. 17C and expressed schematically as follows:

$$B_1 \sin \omega_{VCO}t(C_1 \sin \omega_a t)$$

which appears as a series of football-shaped segments with each segment having its phase inverted as the modulating signal $C_1 \sin \omega_a t$ from digital-to-analog converter 177 crosses zero.

The general expression of successive football-like segments of the waveform of FIG. 17C is as follows:

$$B_1 \sin [\omega_{VCO}t + (N-1)180°](C_1 \sin \omega_a t)$$

In a similar manner, the output ($C_1 \cos \omega_a t$) from the digital-to-analog converter 176 modulates the signal 17D from the hybrid 181 in the balanced modulator 152 to produce the output waveform 17F which is shown in FIG. 17F as another series of football-shaped segments of waveforms with the phase of each segment being reversed 180° from the previous segment. Succeeding segments of the waveform of FIG. 17F are expressed generally as follows:

$$B_1 \cos [\omega_{VCO}t + (N-1)180°](C_1 \cos \omega_a t)$$

The addition of the waveforms of FIGS. 17C and 17F in summer 153 of FIG. 16 will produce a constant phase signal as shown in FIG. 17G and which is defined by the following expression:

$$D \sin (\omega_{VCO} + \omega_a)t$$

The output of summer 153 is supplied to divider circuit 158 which is controlled by coarse control 160 and which supplies a divided signal to phase detector 159. The phase detector 159 compares the received divided signal with the phase of a signal from reference source 161 and supplies an error signal generated thereby through filter 162 to VCO 150 to bring the circuit into a phase locked condition.

If the frequency of the output of summer 153 is increased by $f_a$, due to the modulation produced by the arithmetic synthesizer accumulator 170, the output of VCO 150 will be reduced by frequency $f_a$ to effect the balanced condition in the loop.

Figure 18:
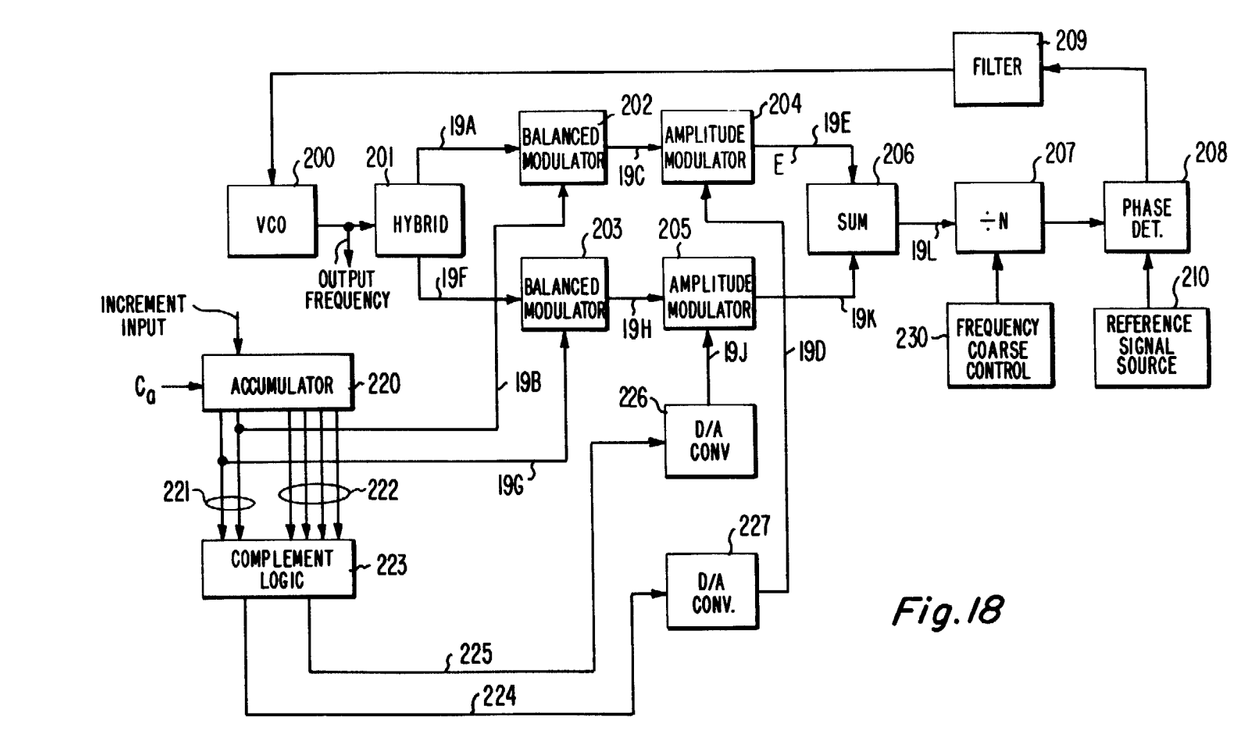
FIG. 18 is a block diagram of still another form of the invention employing an arithmetic synthesizer to effect frequency translation.

Referring now to FIG. 18, there is shown a form of the invention in which the 180° phase shifts of the sine and cosine waveforms derived from the VCO 200 output by hybrid 201 occur in the balanced modulators 202 and 203 by means of the contents of $MSB_1$ and $MSB_2$ which are supplied from accumulator 220. The amplitude modulation of such bi-phase sine and cosine signals is effected by voltage waveforms generated in the lower-order bit positions of the accumulator 220 and supplied to amplitude modulators 204 and 205, with the resulting signals being summed in summer 206 to produce a constant amplitude, constant phase signal similar to that produced by the circuit of FIG. 16.

Figure 19:
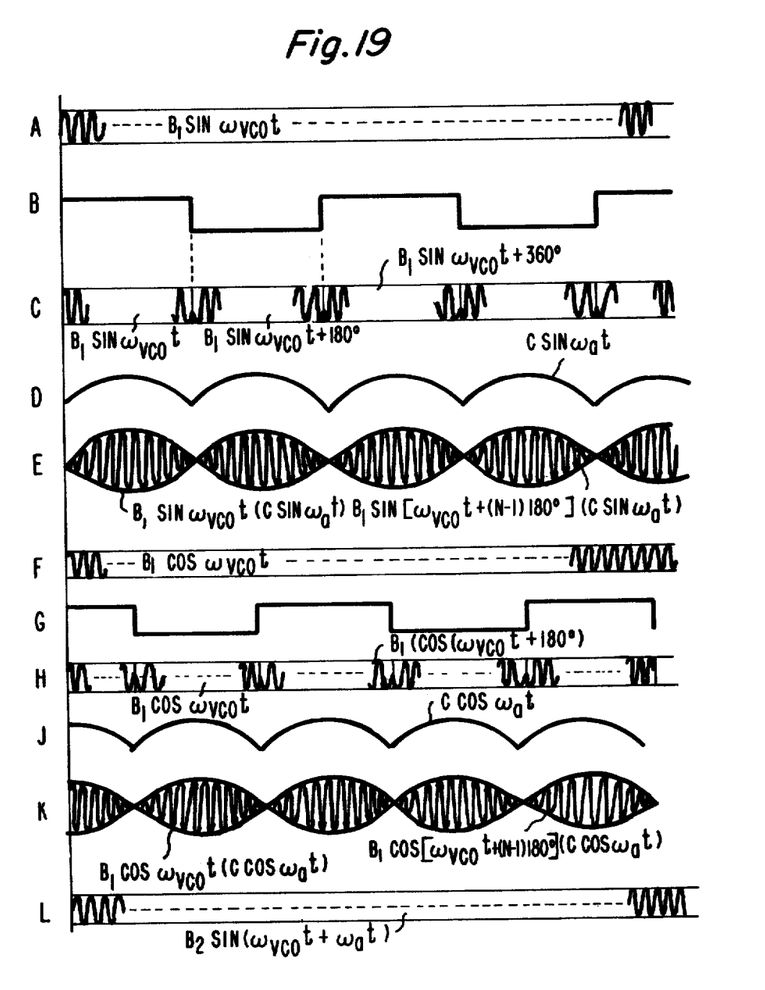
FIG. 19 is a set of waveforms and expressions of signals appearing at various points in the logic diagram of FIG. 18.

In more detail, the output signal of VCO 200 is supplied to hybrid 201 to produce sine and cosine output signals 19A and 19F of frequency $f_{VCO}$, as indicated in FIGS. 19A and 19F. The two most significant bits 221 from accumulator 220 generate (by logic not shown) the quadrature related two-level signals shown in FIGS. 19B and 19G which are supplied to balanced modulators 202 and 203, respectively. It will be noted that the two-level waveforms of FIGS. 19B and 19G are phased 90° apart. Such two-level signals modulate the sine and cosine waveforms 19A and 19F supplied to modulators 202 and 203 from hybrid 201 to produce the waveforms shown in FIGS. 19C and 19H, respectively. The waveform of FIG. 19C, which appears at the output of modulator 202, is a sine wave whose phase varies 180° each time the two-level signal of FIG. 19B changes level. Similarly, the phase of the output signal of modulator 203, shown in FIG. 19H, has its phase inverted each time the two-level signal of FIG. 19G changes level.

Figure 7:
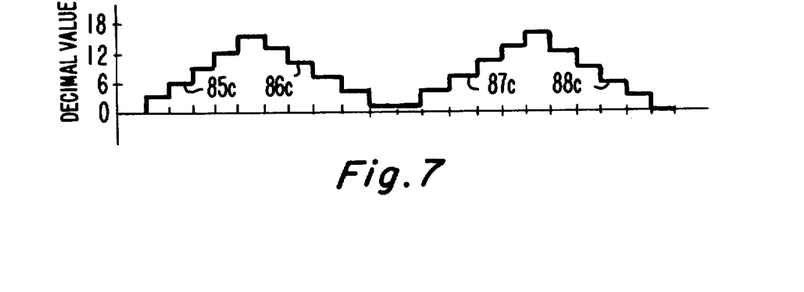
FIG. 7 shows a stepped output of the arithmetic synthesizer which simulates a rectified sine wave when filtered.
Figure 8:
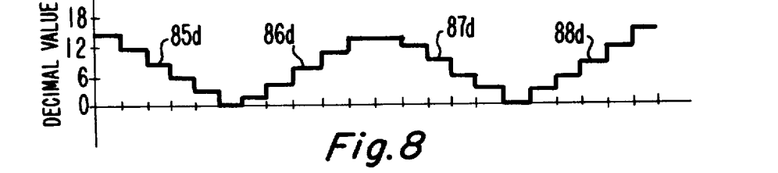
FIG. 8 shows a stepped output of the arithmetic synthesizer which simulates a rectified cosine wave when filtered.

The four least significant bits of accumulator 220 in FIG. 18 are supplied via leads 222 to complement logic 223 whose outputs are then supplied to digital-to-analog converters 226 and 227 which produce the stepped triangular-shaped waveforms of FIGS. 7 and 8.

More specifically, the stepped triangular waveform of FIG. 7 is produced by the digital-to-analog converter 227 and resembles a rectified sine wave of fundamental frequency $f_a$, as shown in FIG. 19D. Such rectified sine wave is supplied to amplitude modulator 204 to modulate the bi-phase output of modulator 202 and thereby produce the waveform shown in FIG. 19E, which can be expressed generally as follows:

$$B_1 \sin [\omega_{VCO}t + (N-1)180°](C \sin \omega_a t)$$

In a similar manner, the complement logic section 223 responds to the four least significant bits appearing on output leads 222 and to the contents of $MSB_1$ and $MSB_2$ to produce signals representing the stepped rectified cosine waveform of FIG. 8. Such signals are supplied to digital-to-analog converter 226 which responds thereto to produce a said stepped rectified cosine wave of frequency $f_a$ which, in turn, is supplied to amplitude modulator 205 to modulate the bi-phase output of balanced modulator 203. The resultant waveform produced at the output of amplitude modulator 205 is shown in FIG. 19K and is defined by the following expression:

$$B_1 \cos [\omega_{VCO}t + (N-1)180°](C \cos \omega_a t)$$

The waveforms shown in FIGS. 19E and 19K are added in summer 206 to produce the waveform of FIG. 19L which is defined as follows:

$$B_2 \sin [\omega_{VCO} + \omega_a t]$$

It is to be noted that the frequency of the above waveform if $f_{VCO}$ *translated by* $f_a$, the frequency of the fill-up time for accumulator 220.

The output of summer 206 is divided by divider 207 (controlled by coarse control means 230) and the divided signal is then supplied to phase detector 208, which also receives a reference signal from reference signal source 210. The output of phase detector 208 is supplied through filter 209 to VCO 200 to vary the frequency of VCO 200 by an amount required to bring the loop into a phase locked condition.

In addition to the frequency translation, including single sideband frequency translation, provided by the arithmetic synthesizer and described in detail herein, a variety of other types of modulations can be imparted to the signal. For example, bi-phase or quadra-phase modulation can be effected by appropriate logic for controlling the phase of the output signal of the accumulator which is then supplied to digital-to-analog converter means and thence to the balanced modulators.

Phase constrained modulators, such as offset-keyed quadrature phase shift keying, unidirectional phase shift keying, and minimum shift keying can also be implemented through inclusion of appropriate control logic.

The various forms of the invention shown and described herein, are preferred embodiments thereof and various changes can be made in logic arrangement and design without departing from the spirit or scope of the invention.

What is claimed is:

1. A frequency synthesizer comprising:
    a voltage controlled oscillator having a first output signal;
    an arithmetic synthesizer having a cyclical frequency $f_a$ and comprising a most significant bit position $MSB_1$, a next most significant bit position $MSB_2$ and a plurality of lower bit positions; and
    a phase lock loop comprising:
    means for generating a reference signal;
    system modulating means responsive to the output signal of said voltage controlled oscillator, the contents of $MSB_1$, $MSB_2$, the contents of said lower bit positions of said arithmetic synthesizer and said reference signal to produce a second output signal;
    said voltage controlled oscillator responsive to said second output signal to cause a frequency change in said first output signal equal to $f_a$.

2. A frequency synthesizer comprising a phase lock loop and an arithmetic synthesizer for varying the frequency of the signal in said phase lock loop;
    said phase lock loop comprising:
    a voltage controlled oscillator;
    system modulating means comprising modulating means within said voltage controlled oscillator and four-phase modulation means responsive to supplied modulating signals to modulate the output signal of said voltage controlled oscillator;
    means for generating a reference signal;
    phase detector means responsive to said reference signal and to the output of said four-phase modulation means to supply an output signal to said voltage controlled oscillator to control the frequency of the output signal thereof;
    an arithmetic synthesizer having a most significant bit position $MSB_1$, a second most significant bit position $MSB_2$ and a plurality of lower order bit positions; and
    means for deriving sine and cosine signals from the output of said voltage controlled oscillator;
    said system modulating means responsive to the binary bit contents of $MSB_1$ and $MSB_2$ to change the phase of said derived sine and cosine signals alternately by 180°, with the vector sum of said sine and cosine signals advancing by discrete phase shift components of 90°, and further responsive to voltage equivalents of the binary bit contents of said lower order bit positions to gradually change the phase of said vector sum between the otherwise 90° discrete phase jumps caused by $MSB_1$ and $MSB_2$.

3. In combination, a phase lock loop comprising:
    voltage controlled oscillator means;
    hybrid means responsive to the output of said voltage controlled oscillator means to produce sine and cosine voltages of the voltage controlled oscillator means output signal frequency;
    phase modulating means comprising a pair of balanced modulators and summing means for receiving, modulating and summing said sine and cosine voltages to produce a resultant modulated output voltage;
    means for generating a reference signal;
    phase detector means responsive to said reference signal and to said resultant modulated output voltage to produce a frequency difference indicating signal;
    filter means for supplying said frequency difference indicating signal to said voltage controlled oscillator means;
    an arithmetic synthesizer having a most significant bit position $MSB_1$, a second most significant bit position $MSB_2$ and a plurality of lower order bits; and
    circuit means including digital-to-analog converter means responsive to the contents of $MSB_1$, $MSB_2$ and to the contents of said lower order bit positions to generate analog signals of predetermined characteristics;

said phase modulating means responsive to the contents of $MSB_1$, $MSB_2$ and to said analog signals to modulate and sum said sine and cosine voltages to produce said resultant modulated output voltage whose phase changes at a substantially constant rate, thereby changing the frequency of the output signal of said voltage controlled oscillator means.

4. A frequency synthesizer comprising:
a phase lock loop comprising:
voltage controlled oscillator means;
quadrature phase modulating means responsive to the output of said voltage controlled oscillator means;
means for generating a reference signal; and
phase detector means responsive to said reference signal and the output of said quadrature phase modulating means to produce a signal for controlling the frequency of the output signal of said voltage controlled oscillator means;
said quadrature phase modulating means comprising:
first and second modulating means;
means for deriving sine and cosine voltages from the output voltage of the voltage controlled oscillator means and for supplying such derived voltages to said first and second modulator means, respectively; and
means for summing the outputs of said first and second modulator means to produce a resultant output voltage;
an arithmetic synthesizer having a most significant bit position $MSB_1$, a second most significant bit position $MSB_2$ and a plurality of lower order bit positions;
said first and second modulator means responsive to predetermined combinations of the contents of $MSB_1$ and $MSB_2$ to invert the phases of said sine and cosine voltages in alternate manner and at equal time intervals to effect 90° shifts in said resultant output voltage and in the output of said voltage controlled oscillator means;
digital-to-analog means for converting the contents of the lower order bit positions of said arithmetic synthesizer into analog signals; and
means for supplying said analog signals into said phase lock loop to effect substantially linear phase shifting of the output signal of the voltage controlled oscillator means between the 90° phase shifts produced by the contents of $MSB_1$ and $MSB_2$.

5. In combination with a phase lock loop comprising:
voltage controlled oscillator means;
means for deriving sine and cosine voltages from the output signal of said voltage controlled oscillator means;
a pair of modulators and a summer for modulating and summing said sine and cosine voltages derived from the output of said voltage controlled oscillator means to produce a resultant modulated output voltage;
means for generating a reference signal; and
means comprising phase detector means responsive to said reference signal and said resulting modulated output voltage to generate and supply a frequency difference indicating signal to said voltage controlled oscillator means;

an arithmetic synthesizer for supplying modulating signals to said modulators and to said voltage controlled oscillator means to produce a continuous phase shift of the said resultant modulated output voltage at a uniform rate, thereby changing the frequency of the output signal of said voltage controlled oscillator means;
said arithmetic synthesizer having a most significant bit position $MSB_1$, a second most significant bit position $MSB_2$, and a plurality of lower order bit positions; and
logic means including digital-to-analog converter means responsive to the contents of said $MSB_1$ and said $MSB_2$ to generate analog signals of predetermined characteristics from the contents of said lower order bit positions of said arithmetic synthesizer;
said modulators responsive to a change in the contents of $MSB_1$ or $MSB_2$ to alternately invert the phases of said sine and cosine voltages to equal time intervals to provide a 90° phase change in said resultant modulated output voltage at each change in the contents of $MSB_1$ or $MSB_2$;
said voltage controlled oscillator means responsive to said analog signals to gradually shift the phase of the output signal thereof towards the next 90° phase shift generated by a change in the contents of $MSB_1$ or $MSB_2$ but eliminating said gradual phase shift immediately before said next 90° phase shift occurs.

6. In combination, a phase lock loop comprising:
voltage controlled oscillator means;
means for deriving sine and cosine signals from the output signal of said voltage controlled oscillator means;
a pair of modulators for receiving and modulating said sine and cosine signals derived from said voltage controlled oscillator;
first and second amplitude modulating means each responsive to the output of one of said modulators;
a summing circuit for producing a summed output signal from the output signals of said amplitude modulating means;
means for generating a reference signal;
circuit means comprising phase detector means responsive to said reference signal and said summed output signal to generate and supply a frequency difference indicating signal to said voltage controlled oscillator means;
arithmetic synthesizer means having a most significant bit position $MSB_1$, a second most significant bit position $MSB_2$, and a plurality of lower order bit positions;
said modulators responsive to predetermined permutations of the contents of $MSB_1$ and $MSB_2$ to alternately invert the phase of said sine and cosine output signals at equal time intervals to provide successive 90° phase changes in said summed output signal at each predetermined permutation of the contents of $MSB_1$ and $MSB_2$; and
logic means including digital-to-analog means for generating analog signals of substantially rectified sine and cosine shapes from the contents of said lower order bit positions of said arithmetic synthesizer and to supply said analog signals to said first and second amplitude modulating means;
said amplitude modulating means responsive to said analog signals to enable a gradual shift of phase of said summed output signal towards the next occurring 90° phase shift to be effected by a change in the contents of $MSB_1$ or $MSB_2$.

7. Means for controlling the frequency of the output signal of a voltage controlled oscillator comprising:
arithmetic synthesizer means having a cyclical frequency $f_a$ and comprising a most significant bit position $MSB_1$, a next most significant bit position $MSB_2$ and a plurality of lower bit positions;
means for altering the cyclical frequency $f_a$ of said arithmetic synthesizer means; and
phase lock loop means comprising:
means for generating a reference signal;
system modulating means responsive to the output of said voltage controlled oscillator, the contents of $MSB_1$, $MSB_2$, said reference signal and the contents of said lower bit positions of said arithmetic synthesizer means to produce a second output signal;
said voltage controlled oscillator responsive to said second output signal to effect a continuous change in phase of the output signal of said voltage controlled oscillator to cause a frequency change in said voltage controlled oscillator output signal of $f_a$.

* * * * *